(12) United States Patent
Jain et al.

(10) Patent No.: US 6,898,746 B2
(45) Date of Patent: May 24, 2005

(54) METHOD OF AND APPARATUS FOR TESTING A SERIAL DIFFERENTIAL/MIXED SIGNAL DEVICE

(75) Inventors: Sunil K. Jain, Folsom, CA (US); Gregory P. Chema, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 420 days.

(21) Appl. No.: 09/883,190

(22) Filed: Jun. 19, 2001

(65) Prior Publication Data

US 2002/0194560 A1 Dec. 19, 2002

(51) Int. Cl.$^7$ ............................................. G01R 31/28
(52) U.S. Cl. ................................. 714/724; 324/765
(58) Field of Search ................................. 714/724, 740, 714/741, 742, 799; 324/765; 702/124; 327/69

(56) References Cited

U.S. PATENT DOCUMENTS

| | | | | |
|---|---|---|---|---|
| 4,044,244 A | * | 8/1977 | Foreman et al. | 714/724 |
| 5,909,186 A | * | 6/1999 | Gohringer | 341/120 |
| 5,951,704 A | * | 9/1999 | Sauer et al. | 714/736 |
| 6,052,810 A | * | 4/2000 | Creek | 714/740 |
| 6,154,715 A | * | 11/2000 | Dinteman et al. | 702/120 |
| 6,323,694 B1 | * | 11/2001 | Creek | 327/69 |
| 6,449,741 B1 | * | 9/2002 | Organ et al. | 714/724 |
| 6,512,989 B1 | * | 1/2003 | Deome et al. | 702/124 |
| 6,536,006 B1 | * | 3/2003 | Sugamori | 714/724 |

OTHER PUBLICATIONS

G. Cauffet et al., Digital Oscilloscope Measurements in High Frequency Power Electronics, IEEE, reference 0–7803–0640–Jun. 1992, pp. 445–447.*

Andrew Grochowski et al., Integrated Circuit Testing for Quality Assurance in Manufacturing: History, Current Status, and Future Trends, 1997, IEEE Transactions on Circuits and Systems–II: Analog and Digital Signal Processing, vol. 44, No. 8, Aug. 1997.*

Information relating to differential oscilloscope usage, interfaces using GPIB, and eye diagram outputs; http://www.tek.com/site/ps/0,,55–16615–SPECS_EN,00.html.*

* cited by examiner

Primary Examiner—Guy J. Lamarre
Assistant Examiner—John P. Trimmings
(74) Attorney, Agent, or Firm—Kenyon & Kenyon (57) ABSTRACT

Testing of a mixed signal electronic device, and evaluating of a test environment. A test driver applies an input test signal to the device. The response of the device is monitored on a differential monitoring device to obtain analog data and on a tester receiver to obtain digital data. The analog data and the digital data are processed, the processed data are compared and evaluated, and the device is evaluted. A virtual test environment is created emulating an actual test environment, and a virtual device emulating the actual device is created and is stimulated with an input test signal emulating an actual input signal. The response of the virtual device is monitored to obtain analog data and digital data. The analog data and the digital data are processed, the processed analog and digital data are compared and evaluated, and the virtual device is evaluated.

42 Claims, 5 Drawing Sheets

METHOD OF AND APPARATUS FOR TESTING A SERIAL DIFFERENTIAL/MIXED SIGNAL DEVICE

FIELD

The present invention pertains to a method of and an apparatus for testing a mixed signal device, such as an electronic device. Further, the present invention pertains to a method of and an apparatus for evaluating performance of a test environment and of an actual device during testing of the device.

BACKGROUND

Electronic devices, such as integrated circuit chips, must be tested following manufacture so as to assure that they have acceptable performance, within their prescribed specifications. Operating speeds of electronic devices are becoming so fast that the devices frequently outperform available test equipment. Additionally, many electronic devices operate on mixed analog signals and digital signals, and so require tests of an analog nature and tests of a digital nature. Although mixed signal testers, capable of testing both analog characteristics and digital characteristics of a device, are known, they generally are unable to provide accurate test results on both analog signals and digital signal. Therefore, in the past separate analog and digital test set ups have generally been utilized to perform acceptance testing of such electronic devices. Not only are multiple pieces of test equipment required, but also an analog test procedure and a separate digital test procedure must be conducted. Consequently, the testing of mixed signal electronic devices is complex, time consuming, and expensive.

Figure 1:
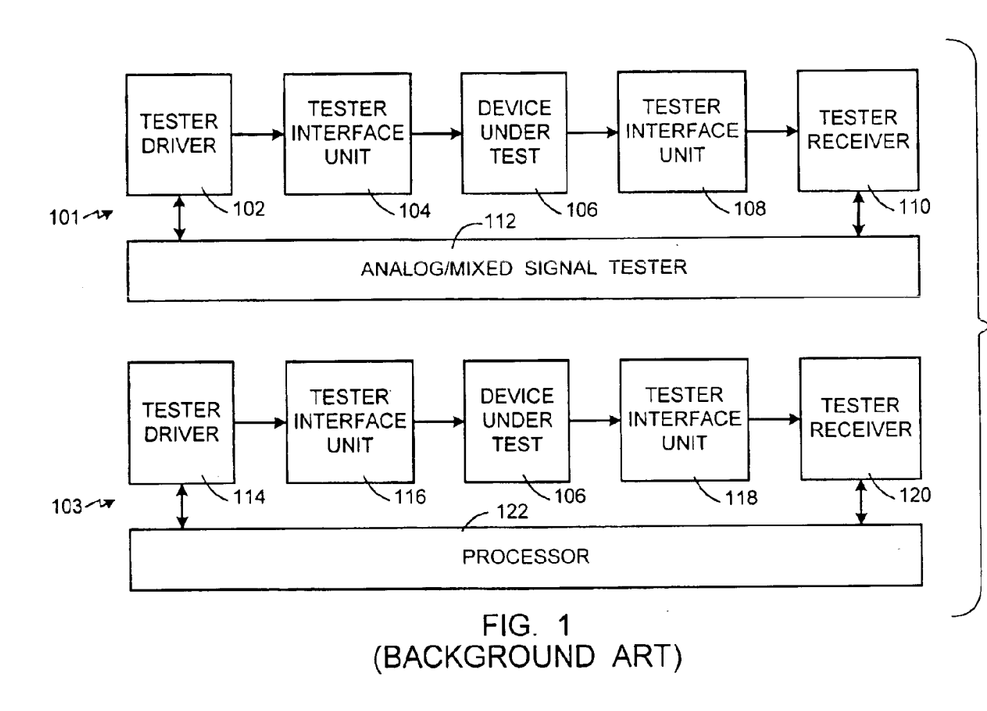
FIG. 1 is a block diagram of a known testing arrangement for testing a mixed signal electronic device.
Figure 2:
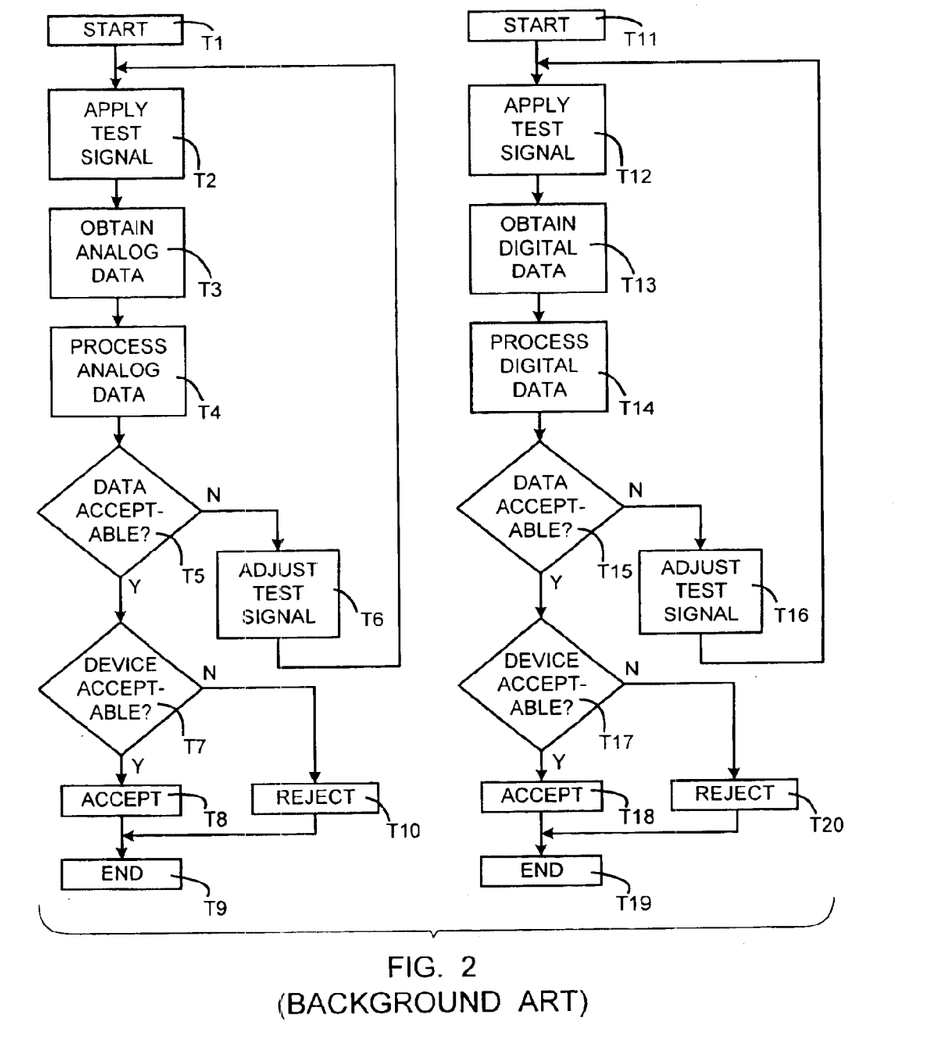
FIG. 2 is a flow chart of a known testing procedure for testing a mixed signal electronic device.

FIGS. 1 and 2, for example, illustrate a known testing arrangement and procedure for testing a mixed signal electronic device. The arrangement includes analog test set up 101 and digital test set up 103. The analog procedure starts in step T1, and in step T2 tester driver 102 of analog test set up 101 provides an input test signal through a tester interface unit 104 to mixed signal electronic device under test 106. In step T3, the resulting output test signal from device 106 is applied through tester interface unit 108 to tester receiver 110. Tester 112 receives inputs from tester driver 102 and from tester receiver 110 and in step T4 processes analog data from the device output signal. Tester 112 might be an analog tester or a mixed signal tester. In step T5 tester 112 determines whether the analog data are acceptable. If not, then in step T6 tester 112 adjusts the test signal, and the process returns to step T2. If the analog data are acceptable, then in step T7, tester 112 determines whether device 106 is acceptable. If so the device is accepted in step T8, and the process ends in step T9. If step T7 determines that device 106 is not acceptable, the device is rejected in step T10, and the process ends in step T9.

Once the analog testing is completed, device 106 is moved to digital test set up 103 and the digital test procedure starts in step T11. In step 112 tester driver 114 provides an input test signal through a tester interface unit 116 to mixed signal device 106. In step T13, the resulting output test signal from device 106 is applied through tester interface unit 118 to tester receiver 120. Processor 122 receives inputs from tester driver 114 and from tester receiver 120 and in step T14 processes digital data from the device output signal. In step T15 processor 122 determines whether the processed digital data are acceptable. If not, then in step T16 processor 122 adjusts the test signal, and the process returns to step T12. If the digital data are acceptable, then in step T17, tester 122 determines whether device 106 is acceptable. If so, the device is accepted in step T18, and the process ends in step T19. If step T17 determines that the device is not acceptable, the device is rejected in step T20, and the process ends in step T19. This testing requires two test set ups 101 and 103 and two test procedures. Alternatively, if tester 112 is a mixed signal tester, the device is left there, and the digital test procedure is performed on it. In either case, it is expensive and time consuming to test a mixed signal device.

In addition, the accuracy of the test equipment itself must be assured. The electronic device under test is to be utilized as a part of an overall system. In such use, the electronic device is generally mounted on a circuit board, such as a motherboard, and is electrically connected to other components on the circuit board. During testing, however, the electronic device is connected to test equipment which may not accurately emulate the performance of the components on the circuit board. During such testing, the electronic device is provided with an input signal from the test equipment and applies an output signal to the test equipment; whereas, in use the input signal is received from another component on the circuit board, and the output signal is provided to a further component on the circuit board. The test equipment which provides the input test signal and receives the output test signal generally includes a general purpose tester that is utilized during testing of numerous types of electronic devices, and a tester interface unit that is specially designed for use with the specific electronic device under test. Even though the test equipment is designed to emulate the other circuit components on the motherboard, that emulation is not total. By way of example, signal propagation times may be different. Output impedances, particularly capacitances, may differ. In general, the integrity of the input and output signals is different during testing as compared with during actual use. As a result, performance on the test equipment does not accurately emulate the performance on the circuit board. This problem is exacerbated when there are multiple types of electronic devices, and so multiple types of inputs and outputs, on the circuit board.

Further, in designing a new electronic device, a proposed design often is simulated on a processing system and evaluated at various points in the design process so that any need for design changes can be made and tested, The processing system emulates not only the electronic device, but also test arrangements and procedures for the device. Again, both analog and digital characteristics of the design of a mixed signal electronic device must be tested.

SUMMARY

In one aspect, the present invention is a method of and an apparatus for testing a mixed signal electronic device. In the method of this aspect of the present invention, an input test signal is applied to the electronic device. The input test signal has at least one of an analog component, a digital component, and a differential component. The response of the device is monitored on a differential monitoring device to obtain analog data. The response of the device is also monitored on a tester receiver to obtain digital data. The analog data and the digital data are processed. During the processing, analog data and digital data are fed back and exchanged between the two processing functions so as to optimize the processing. Following the processing, the processed data are compared. Depending upon the result of the comparison, the processing of the analog data and the digital data may be continued. Once the processing is completed, the data are evaluated. If the data are not acceptable, the test signal is adjusted, and the process is repeated. Once acceptable data are obtained, the device is evaluated. If the device is acceptable, it is accepted, but if the device is not acceptable, it is rejected. The process then ends.

The apparatus for testing a device in accordance with this aspect of the invention thus includes a tester driver for applying to the mixed signal electronic device an input test signal having at least one of an analog component, a digital component and a differential component; a differential monitoring device for monitoring the response of the device to obtain the analog data; a tester receiver for monitoring the response of the device to obtain digital data; a processing unit for processing the analog data and the digital data; a comparison unit for comparing the processed analog data and the processed digital data; and an evaluation unit for evaluating the compared data to determine whether the data are acceptable and to determine whether the device is acceptable. The apparatus might be implemented on a properly programmed general purpose processing system.

In a second aspect, the present invention is a method of and an apparatus for evaluating performance of an actual test environment and an actual device, such as a mixed signal electronic device, during testing of the device. In accordance with this method, a virtual test environment is created emulating an actual test environment in which the actual device is to be tested, and a virtual device emulating the actual device is implanted in the virtual test environment and is stimulated with an input test signal emulating an actual input signal to be applied to the actual device during testing. The response of the virtual device is monitored on a virtual differential monitoring device to obtain analog data and is monitored on a virtual tester receiver to obtain digital data. The analog and digital data are processed. During the processing, analog data and digital data are fed back and exchanged between the two processing functions so as to optimize the processing. Following the processing, the processed first and second data are compared. Depending upon the results of the comparison, the processing may be continued. Once the processing is completed, the data are evaluated. If the data are not acceptable, the signal which stimulates the virtual device is adjusted, and the process is repeated. Once acceptable data are obtained, the virtual device is evaluated. If the virtual device is acceptable, it is accepted, but if the virtual device is not acceptable, it is rejected. The process then ends.

The apparatus for evaluating performance of a test environment and an actual device includes a virtual device, a virtual tester driver, a virtual differential monitoring device, a virtual tester receiver, a virtual processing unit, a virtual comparison unit, and a virtual evaluation unit. These may be implemented on a properly programmed general purpose processing system.

BRIEF DESCRIPTION OF THE DRAWINGS

These and other aspects and advantages of the present invention are more apparent from the following detailed description and claims, particularly when considered in conjunction with the accompanying drawings. In the drawings:

DETAILED DESCRIPTION

Figure 3:
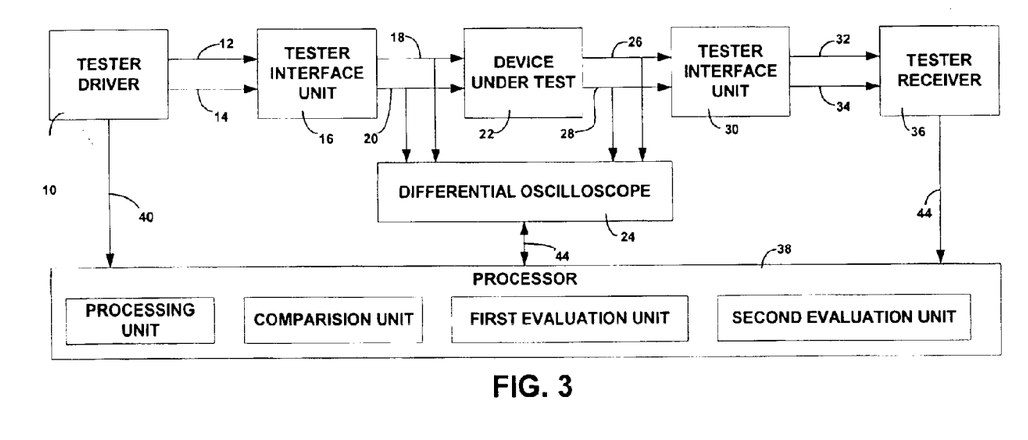
FIG. 3 is a block diagram of an apparatus for testing a mixed signal electronic device in accordance with a preferred embodiment of the present invention.

FIG. 3 is a block diagram of a preferred embodiment of an apparatus for testing a device, such as a mixed signal electronic device, in accordance with the present invention. The apparatus includes a tester driver 10 which is coupled by lines 12 and 14 to a tester interface unit 16. Tester interface unit 16 is coupled by lines 18 and 20 to a device under test 22 and to a differential monitoring device such as a differential oscilloscope 24. The output of device under test 22 is coupled by lines 26 and 28 to tester interface unit 30 and to differential oscilloscope 24. Tester interface unit 30 is coupled by lines 32 and 34 to tester receiver 36. Processor 38 is connected by line 40 to tester driver 10, by line 42 to tester receiver 36, and by line 44 to differential oscilloscope 24. Processor 38 includes a first processing algorithm for processing analog data and a second processing algorithm for processing digital data. The two algorithms are able to feed back and exchange data so as to optimize processing.

Tester driver 10 and tester receiver 36 are general purpose test equipment suitable for testing various devices. Tester interface units 16 and 30 are specifically designed for coupling tester driver 10 and tester receiver 36, respectively, to a particular device under test 22. Tester driver 10 provides a differential signal through tester interface unit 16 to differential oscilloscope 24 and to device 22, and a differential output from device 22 is provided to oscilloscope 24 and through tester interface unit 30 to tester receiver 36.

Figure 4:
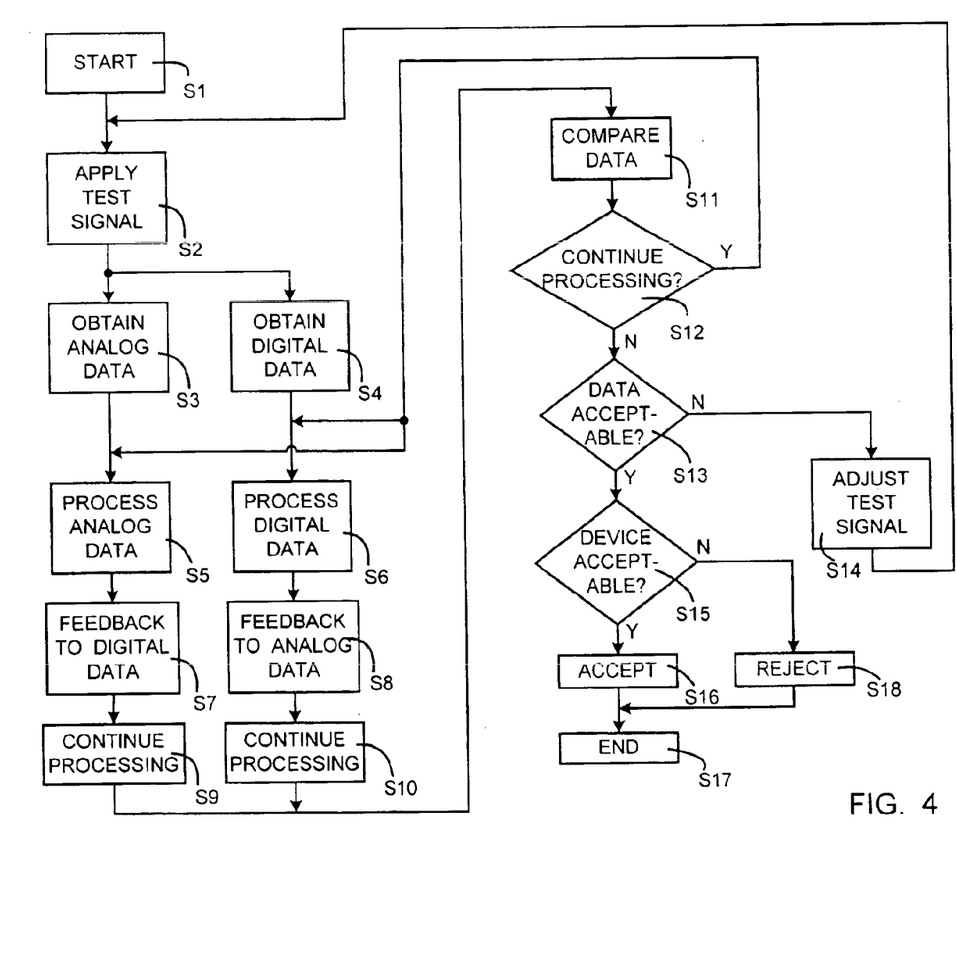
FIG. 4 is a flowchart of a method of testing a mixed signal electronic device in accordance with a preferred embodiment of the present invention.

FIG. 4 is a flowchart of a preferred embodiment of a method of testing a device, such as a mixed signal electronic device, for example an integrated circuit chip, on the test equipment of FIG. 3. The method starts in step S1, and in step S2 tester driver 10 applies a test signal through tester interface unit 16 to device under test 22 and to differential oscilloscope 24. The output from device 22 passes through tester interface unit 30 to tester receiver 36 and also is applied to differential oscilloscope 24. In step S3 differential oscilloscope 24 obtains analog data as a result of that output, and in step S4 tester receiver 36 obtains digital data as a result of the output. The analog data and digital data are applied by oscilloscope 24 and tester receiver 36 to processor 38, and in step S5 the analog data are processed, while simultaneously in step S6 the digital data are processed. This processing might include, for example, quantifying the output, determining the quality of the waveforms in the output, determining duty cycle, crossover or noise levels, determining the amount of jitter in the output, creating an eye diagram from the output and then determining whether the eye diagram meets specified boundary conditions, determining the rise time and the fall time of signals within the eye diagram, and/or determining the range of rise times and fall times of waveforms of the eye diagram. In steps S7 and S8 analog data and digital data are fed back and exchanged between the processing functions so as to optimize the processing which continues in steps S9 and S10.

Following the processing, the processed data are compared in step S11. In step S12 the result of the comparison is evaluated to determine whether the processing should continue. If so, then the method returns to steps S5 and S6, and the processing is continued. Once it is determined in step S12 that the processing is not to continue, then it is determined in step S13 whether the data are acceptable. If not, then in step S14 the test signal is adjusted, and the process returns to step S2. The test signal might be adjusted by adjusting the test signal frequency, adjusting the test signal level, or making other suitable adjustments. Once acceptable data are obtained in step S13, it is determined in step S15 whether the device under test is acceptable. If so, the device is accepted in step S16, and the process ends in step S17. If step S15 determines that the device is not acceptable, the device is rejected in step S18, and the process ends in step S17.

Processor 38 of FIG. 3 includes a processing unit, a comparison unit, and evaluation units to perform steps S5 to S15 of FIG. 4. The apparatus of FIG. 3 and the method of FIG. 4 are able to provide accurate testing of mixed signal electronic devices in a rapid manner. This is particularly true since multiple tests are not necessary, and the device under test does not have to be moved between multiple pieces of test equipment. Instead, the device can be fully evaluated, as to its analog characteristics, its digital characteristics and its differential characteristics, in a single test procedure within a single test set up.

Figure 5:
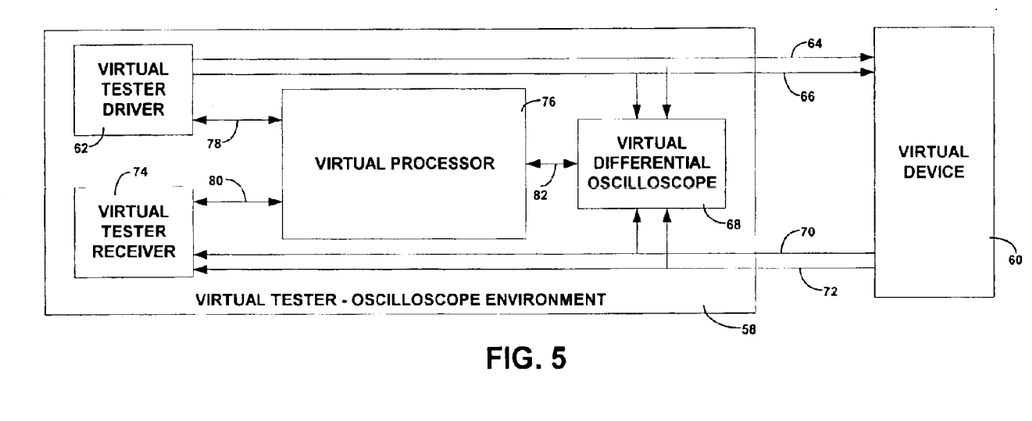
FIG. 5 is a block diagram of an apparatus for evaluating the performance of a test environment and of an actual mixed signal electronic device during testing of the actual device in accordance with a preferred embodiment of the present invention.

FIG. 5 is a block diagram of a preferred embodiment of an apparatus in accordance with the present invention for evaluating the performance of a test environment and of an actual device such as a mixed signal electronic device, for example an integrated circuit chip. The apparatus includes a virtual tester-oscilloscope environment 58 and a virtual device 60. Environment 58 includes a virtual tester driver 62 which emulates an actual tester driver and an actual tester interface unit and which is connected by lines 64 and 66 to virtual device 60 and to virtual differential oscilloscope 68. Virtual device 60 emulates an actual device, and virtual differential oscilloscope emulates an actual differential oscilloscope. The output of virtual device 60 is connected by lines 70 and 72 to virtual tester receiver 74 and to virtual oscilloscope 68. Virtual tester receiver 74 emulates an actual tester receiver and an actual tester interface unit. Virtual processor 76 is coupled to virtual tester driver 62 by line 78, to virtual tester receiver 74 by line 80, and to virtual oscilloscope 68 by line 82. Virtual processor 76 emulates an actual processor and includes a first processing algorithm for processing analog data from virtual differential oscilloscope 68 and a second processing algorithm for processing digital data from virtual tester receiver 74. The two algorithms are able to feed back and exchange data so as to optimize the processing.

Figure 6:
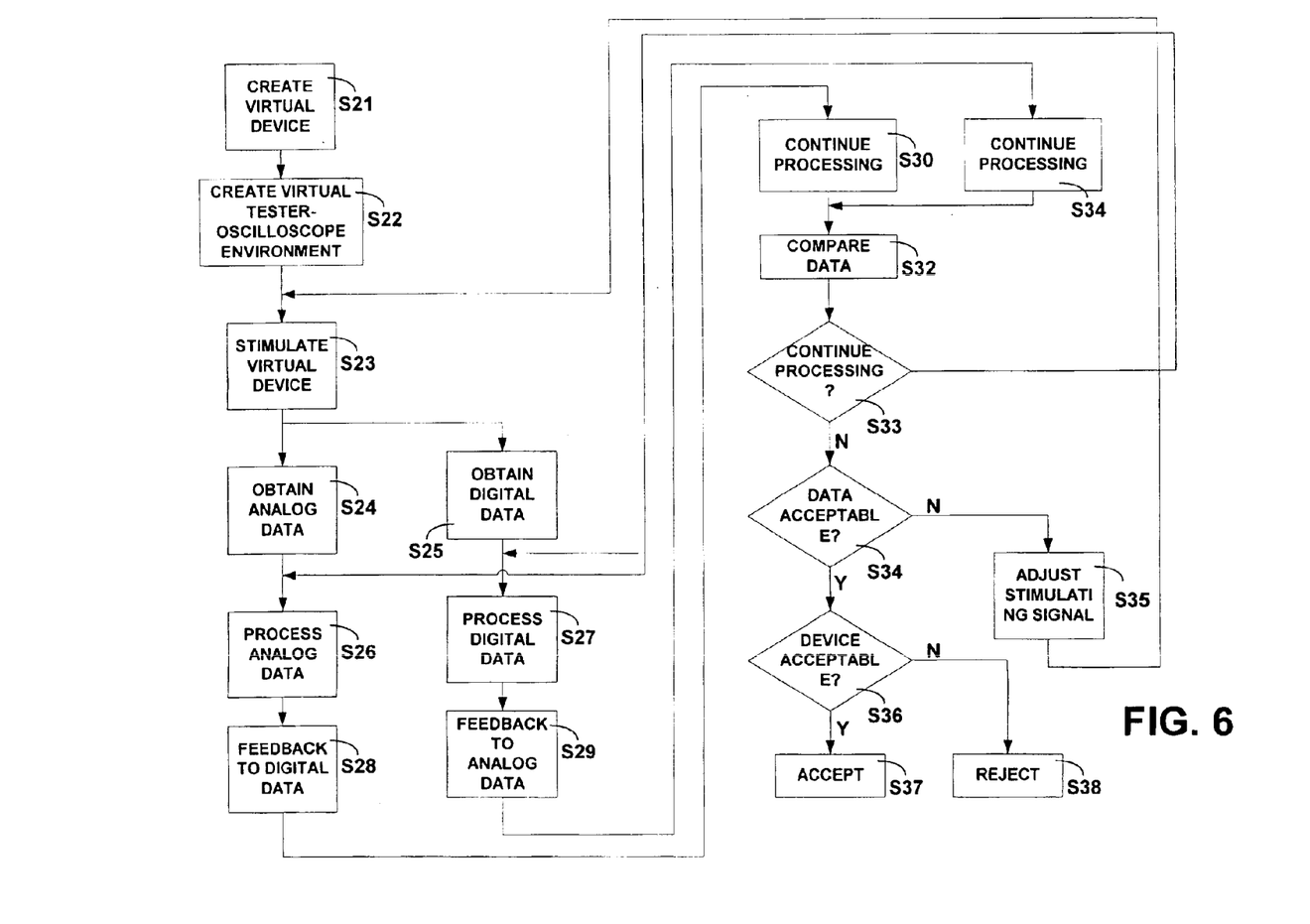
FIG. 6 is a flowchart of a preferred embodiment of a method of evaluating performance of a test environment and an actual mixed signal electronic device during testing of the actual device in accordance with the present invention.

FIG. 6 is a flow chart of a preferred embodiment of a method of evaluating performance of a test environment and an actual electronic device during testing of the electronic device on the apparatus of FIG. 5. In step S21 virtual device 60 is created, and in step S22 virtual tester-oscilloscope environment 58 is created. These two steps might be performed in either sequence. In step S23, virtual tester driver 62 applies a signal to stimulate virtual device 60. That signal emulates an actual test signal that might be applied to an actual device emulated by virtual device 60. In step S24 analog data are obtained by virtual differential oscilloscope 68, while in step S25 digital data are obtained by virtual tester receiver 74. In steps S26 and S27, the analog data and the digital data are processed by the first and second processing algorithms of processor 76. In steps S28 and S29, analog data and digital data are fed back and exchanged between the two processing algorithms so as to optimize the processing, which continues in steps S30 and S31. In step S32, the processed data are compared, and in step S33 it is determined whether the results of the comparison indicate that the processing should continue. If so, then the method returns to steps S26 and S27 for further processing of the data. Once it is determined in step S33 that the processing is not to continue, then in step S34 it is determined whether the data are acceptable. If not, then in step S35 the stimulating signal is adjusted, and the method returns to step S23. Once it is determined tin step S34 that the data are acceptable, it is determined in step S36 whether the device under test is acceptable. If so, the device is accepted in step S37, and the process ends. If step S36 determines that the device is not acceptable, the device is rejected in step S38, and the process ends. The processing of the first and second data in steps S26, S27, S30, and S31 and the adjusting of the stimulating signal in step S35 can be similar to the respective corresponding steps S5, S6, S9, S10, and S14 performed during the method of FIG. 4.

Figure 7:
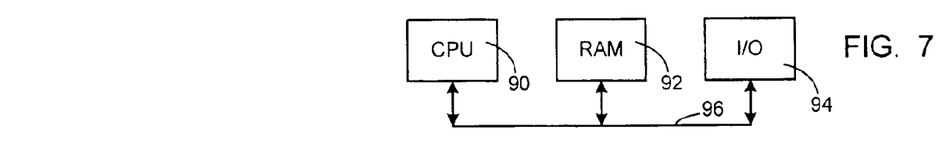
FIG. 7 is a block diagram of a preferred implementation of an apparatus for evaluating the performance of a test environment and of an actual mixed signal electronic device during testing in accordance with the present invention.

Virtual processor 76 of FIG. 5 includes a virtual processing unit, a virtual comparison unit, and virtual evaluation units to perform steps S26 to S36. The virtual tester-oscilloscope environment of FIG. 5 can be implemented on a properly programmed general purpose processing system. As depicted in FIG. 7, such a system might include a central processing unit 90, a memory such as a random access memory 92, and an input/output unit 94, all of which are coupled together by a bus 96.

The apparatus of FIG. 5 and the method of FIG. 6 enable evaluating of the performance of a test environment, such as that of FIG. 1, during the testing of an actual device, such as an electronic device, so that the test environment is optimized before implementation. Such optimization can be utilized in designing tester interface units 16 and 30. Further, that apparatus and method enable evaluating a proposed design of a mixed signal electronic device on a simulated device during the design process.

Although the present invention has been described with reference to preferred embodiments, various rearrangements, alterations, and substitutions might be made, and still the result would be within the scope of the invention.

What is claimed is:

1. A method of testing an electronic device, said method comprising:

applying to the electronic device input test signals having an analog signal component, a digital signal component, and a differential signal component;

monitoring the response of the electronic device on a differential monitoring device to obtain analog data;

monitoring the response of the electronic device on a tester receiver to obtain digital data;

processing the analog data, processing the digital data;

comparing the processed analog data with the processed digital data;

evaluating the compared data; and evaluating the electronic device based on the evaluated data.

2. A method as claimed in claim 1, wherein the processing of the analog data and processing of the digital data includes feeding back analog data for use in processing of the digital data, and feeding back digital data for use in processing of the analog data.

3. A method as claimed in claim 1, further comprising, following the comparing, again processing the analog data and the digital data, and comparing the reprocessed analog data and the reprocessed digital data.

4. A method as claimed in claim 1, further comprising, following evaluating the compared data, adjust ting the input test signal, and repeating the method.

5. A method as claimed in claim 4, wherein the test signal is adjusted by adjusting the test signal frequency.

6. A method as claimed in claim 4, wherein the test signal is adjusted by adjusting the test signal level.

7. A method as claimed in claim 1, wherein monitoring the response of the electronic device on a differential monitoring device comprises monitoring the response on a differential oscilloscope.

8. A method as claimed in claim 1, wherein processing the analog data and the digital data comprises determining the rise time and the fall time of a signal in the response of the electronic device.

9. A method as claimed in claim 1, wherein processing the analog data and the digital data comprises determining the ranges of rise times and of fall times within a signal in the response of the electronic device.

10. A method as claimed in claim 1, wherein monitoring the response of the electronic device comprises monitoring an eye diagram.

11. A method as claimed in claim 10, wherein processing the analog data and the digital data comprises determining a rise time and a fall time of a signal in the eye diagram.

12. A method as claimed in claim 10, wherein processing the analog data and the digital data comprises determining the ranges of rise times and of fail times within a signal in eye diagram.

13. A method as claimed in claim 10, wherein processing the analog data and the digital: data comprises monitoring boundary conditions in the eye diagram.

14. Apparatus for testing an electronic device, said apparatus comprising:
a tester driver for applying to the electronic device input test signals having an analog signal component, a digital signal component, and a differential signal component;
a differential monitoring device for monitoring the response of the electronic device to obtain analog data;
a tester receiver for monitoring the response of the electronic device to obtain digital data;
a processing unit for processing the analog data and the digital data;
a comparison unit for comparing the processed analog data with the processed digital data,
a first evaluation unit for evaluating the compared data; and
a second evaluation unit for evaluating the electronic device.

15. An apparatus as claimed in claim 14, wherein said processing unit is capable of feeding back analog data for use in processing of the digital data, and of feeding back digital data for use in processing of the analog data.

16. An apparatus as claimed in claim 14, wherein said processing unit is responsive to a comparison result of a preselected type from said comparison unit to again process the analog data and the digital data.

17. Apparatus as claimed in claim 14, wherein said first evaluation unit is responsive to an evaluation result of a first type for adjusting the input test signal.

18. An article, comprising a storage medium having instructions stored thereon, the instructions when executed testing an electronic device by applying to the electronic device input test signals having an analog signal component, a digital signal component, and a differential signal component; actuating a differential monitoring device to monitor the response of the electronic device so as to obtain analog data; actuating a tester receiver to monitor the response of the electronic device so as to obtain digital data; processing the analog data; processing the digital data, comparing the processed analog data with the processed digital data; evaluating the compared data; and evaluating the electronic device based on the evaluated data.

19. An article as claimed in claim 18, wherein during processing of the analog data and the digital data, the instructions when executed feed back analog data for use in processing of the digital data and feed back digital data for use in processing of the analog data.

20. An article as claimed in claim 18, wherein following the comparing, the instructions when executed again process the analog data and the digital data, and compare the reprocessed analog data and the reprocessed digital data.

21. An article as claimed in claim 18, wherein following evaluating the compared data, the instructions when executed adjust the input test signal, and repeat the test.

22. An article as claimed in claim 21, wherein the instructions when executed adjust the test signal by adjusting the test signal frequency.

23. An article as claimed in claim 21, wherein the instructions when executed adjust test signal by adjusting the test signal level.

24. An article as claimed in claim 18, wherein the instructions when executed monitor the response by determining the rise time and the fall time of a signal in the response.

25. An article as claimed in claim 18, wherein the instructions when executed monitor the response by determining the ranges of rise times and of fall times within a signal in the response.

26. An article as claimed in claim 18, wherein the instructions when executed monitor the response by monitoring an eye diagram in the response.

27. An article as claimed in claim 26, wherein the instructions when executed monitor the response by monitoring boundary conditions in the eye diagram.

28. A method of evaluating performance of a test environment and an actual electronic device during testing of the electronic device, said method comprising:
creating a virtual test environment emulating an actual test environment in which the actual electronic device is to be tested;
creating a virtual device emulating the actual electronic device;
stimulating the virtual device with an input test signal emulating actual input signals to be applied to the actual electronic device during testing, the input test signals further comprising an analog signal component, a digital signal component, and a differential signal component;
monitoring the response of the virtual device on a virtual differential monitoring device emulating an actual differential monitoring device to obtain analog data;
monitoring the response of the virtual device on a virtual tester receiver emulating an actual tester receiver to obtain digital data;

processing the analog data;

processing the digital data;

comparing the processed analog data with the processed digital data;

evaluating the compared data; and evaluating the virtual device based on the evaluated data.

29. A method as claimed in claim 28, wherein the processing of the analog data and processing of the digital data includes feeding back analog data for use in processing of the digital data, and feeding back of digital data for use in processing of the analog data.

30. A method as claimed in claim 28, further comprising, following the comparing, again processing the analog data and the digital data, and comparing the reprocessed analog data and the reprocessed digital data.

31. A method as claimed in claim 28, further comprising, following evaluating the compared data, adjusting the input test signal, and repeating the method.

32. A method as claimed in claim 28, wherein monitoring the response of the electronic device on a virtual differential monitoring device comprises monitoring the response on a virtual differential oscilloscope.

33. Apparatus for evaluating the performance of a test environment and of an actual electronic device, said apparatus comprising:

a virtual device emulating the actual electronic device;

a virtual tester driver, emulating an actual tester driver, to apply to said virtual device an input test signal emulating actual input signals to be applied to the actual electronic device during testing, the actual input signals having an analog signal component, a digital signal component, and a differential signal component;

a virtual differential monitoring device, emulating on actual differential monitoring device, for monitoring the response of the virtual device to obtain analog data;

a virtual tester receiver, emulating an actual tester receiver, for monitoring the response of the virtual device to obtain digital data;

a virtual processing unit, emulating an actual processing unit, for processing the analog data and the digital data;

a virtual comparison unit, emulating an actual comparison unit, for comparing the processed analog data with the processed digital data;

a first virtual evaluation unit, emulating an actual evaluation unit, for evaluating the compared data; and a second virtual evaluation unit, emulating an actual evaluation unit, for evaluating the virtual device.

34. Apparatus as claimed in claim 33, wherein said virtual processing unit is capable of feeding back analog data for use in processing of the digital data, and of feeding back digital data for use in processing of the analog data.

35. Apparatus as claimed in claim 33, wherein said differential monitoring device comprises a differential oscilloscope.

36. Apparatus as claimed in claim 33, comprising a general purpose processing system.

37. An article, comprising a storage medium having instructions stored thereon, the instructions when executed evaluating performance of a test environment and an actual electronic device during testing of the actual electronic device by creating a virtual test environment emulating an actual test environment in which the actual electronic device is to be tested; creating a virtual device emulating the actual electronic device; stimulating the virtual device with an input test signal emulating actual input signals to be applied to the actual electronic device during testing; the actual input signals having an analog signal component, a digital signal component, and a differential signal component, actuating a virtual differential monitoring device, emulating an actual differential monitoring device, to monitor the response of the virtual device so as to obtain analog data; actuating a virtual tester receiver, emulating an actual tester receiver, to monitor the response of the virtual device so as to obtain digital data; processing the analog data and the digital data; comparing the processed analog data with the processed digital data, evaluating the compared data; and evaluating the virtual device based on the evaluated data.

38. An article as claimed in claim 37, wherein during processing of the analog data and the digital data, the instructions when executed feed back analog data for use in processing of the digital data and feed back digital data for use in processing of the analog data.

39. An article as claimed in claim 37, wherein following the comparing, the instructions when executed again process the analog data and the digital data, and compare the reprocessed analog data and the reprocessed digital data.

40. An article as claimed in claim 37, wherein following the evaluating of the compared data, the instructions when executed adjust the input test signal, and repeat the method.

41. An article as claimed in claim 37, wherein the instructions when executed monitor the response of the electronic device an a virtual differential monitoring device by monitoring the response on a virtual differential oscilloscope.

42. A method of testing an electronic device, said method comprising:

applying to the electronic device input test signals having an analog signal component, a digital signal component, and a differential signal component;

obtaining analog data by monitoring the response of the electronic device on a differential monitoring device;

obtaining digital data by monitoring the response of the electronic device on a tester receiver;

processing the analog data and the digital data independently and simultaneously, comparing the processed analog data with the processed digital data;

evaluating the compared data; and evaluating the electronic device based on the evaluated data.

* * * * *

UNITED STATES PATENT AND TRADEMARK OFFICE
CERTIFICATE OF CORRECTION

PATENT NO. : 6,898,746 B2 Page 1 of 1
DATED : May 24, 2005
INVENTOR(S) : Sunil K. Jain et al.

It is certified that error appears in the above-identified patent and that said Letters Patent is hereby corrected as shown below:

<u>Column 7,</u>
Line 13, "adjust ting the input" should be -- adjusting the input --.
Line 41, "the digital: data comprises" should be -- the digital data comrpises --.

Signed and Sealed this

Fifteenth Day of November, 2005

JON W. DUDAS
*Director of the United States Patent and Trademark Office*